United States Patent
Yanagihara et al.

(10) Patent No.: US 7,375,407 B2
(45) Date of Patent: May 20, 2008

(54) SCHOTTKY BARRIER DIODE AND INTEGRATED CIRCUIT USING THE SAME

(75) Inventors: Manabu Yanagihara, Osaka (JP); Yasuhiro Uemoto, Shiga (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/271,833

(22) Filed: Nov. 14, 2005

(65) Prior Publication Data
US 2006/0108605 A1 May 25, 2006

(30) Foreign Application Priority Data
Nov. 22, 2004 (JP) .............................. 2004-338015

(51) Int. Cl.
*H01L 29/47* (2006.01)
(52) U.S. Cl. ................. 257/471; 257/472; 257/E29.338
(58) Field of Classification Search ........ 257/470–473, 257/E29.338, E31.065
See application file for complete search history.

(56) References Cited

U.S. PATENT DOCUMENTS

| | | | |
|---|---|---|---|
| 3,673,514 A * | 6/1972 | Coleman et al. ........ | 331/107 R |
| 6,261,932 B1 * | 7/2001 | Hulfachor .................. | 438/570 |
| 6,426,542 B1 * | 7/2002 | Tan ............................. | 257/483 |
| 6,501,145 B1 | 12/2002 | Kaminski et al. | |
| 6,570,490 B1 * | 5/2003 | Saitoh et al. .............. | 340/10.1 |
| 6,787,871 B2 * | 9/2004 | Asano et al. ............... | 257/471 |
| 2004/0061194 A1 * | 4/2004 | Ikeda et al. ................. | 257/471 |
| 2005/0242366 A1 * | 11/2005 | Parikh et al. .............. | 257/104 |
| 2005/0274977 A1 * | 12/2005 | Saito et al. ................. | 257/192 |

FOREIGN PATENT DOCUMENTS

| | | | |
|---|---|---|---|
| JP | 06-005842 | * | 1/1994 |
| JP | 11-354817 | | 12/1999 |
| JP | 2000-208813 | | 7/2000 |
| JP | 2003-060212 | | 2/2003 |
| JP | 2003-229566 | | 8/2003 |
| JP | 2003-282863 | | 10/2003 |
| JP | 2004-031896 | | 1/2004 |

\* cited by examiner

*Primary Examiner*—Tuan N. Quach
(74) *Attorney, Agent, or Firm*—McDermott Will & Emery LLP

(57) ABSTRACT

A Schottky barrier diode includes a first semiconductor layer and a second semiconductor layer successively formed above a substrate; and a high-resistance region formed in the first semiconductor layer and the second semiconductor layer and having higher resistance than the first semiconductor layer and the second semiconductor layer. A Schottky electrode and an ohmic electrode spaced from each other are formed on the second semiconductor layer in a portion surrounded with the high-resistance region.

11 Claims, 8 Drawing Sheets

SCHOTTKY BARRIER DIODE AND INTEGRATED CIRCUIT USING THE SAME

CROSS-REFERENCE TO RELATED APPLICATIONS

This application claims priority under 35 U.S.C. §119 on Patent Application No. 2004-338015 filed in Japan on Nov. 22, 2004, the entire contents of which are hereby incorporated by reference.

BACKGROUND OF THE INVENTION

The present invention relates to a Schottky barrier diode using a nitride semiconductor material and an integrated circuit using the same.

Nitride semiconductors typified by GaN are being earnestly developed for application to electronic devices such as a field effect transistor (FET) and a Schottky barrier diode (SBD) by taking advantage of their merits such as a high breakdown voltage and a high saturated electronic velocity. An SBD is required to have a high breakdown voltage and a low on resistance, and in order to realize a high breakdown voltage in a conventional SBD using a silicon (Si) material, it is necessary to lower a carrier concentration and increase the thickness of a drift layer where a depletion layer extends in applying a backward bias voltage. The drift layer is, however, a region where electrons pass in applying a forward bias voltage, and hence, the on resistance is increased when the thickness of the drift layer is increased. On the contrary, when a nitride material such as GaN with a high breakdown voltage is used, an SBD can attain a high breakdown voltage even when the thickness of a drift layer is decreased, and therefore, such an SBD attains a low on resistance and a high breakdown voltage.

CONVENTIONAL EXAMPLE 1

FIG. 10 shows the cross-sectional structure of an SBD using a nitride semiconductor material according to Conventional Example 1 (see, for example, Japanese Laid-Open Patent Publication No. 2003-60212). As shown in FIG. 10, a buffer layer 103 made of aluminum nitride (AlN) or a superlattice structure of AlN and GaN is formed on an n-type silicon ($n^+$-Si) substrate 102, and an n-type GaN layer 104 is formed on the buffer layer 103. A Schottky electrode (anode) 105 is formed on the n-type GaN layer 104, and an ohmic electrode (cathode) 101 is formed on the back face of the substrate 102.

In the case where a backward bias voltage is applied to this SBD, a depletion layer extends in the n-type GaN layer 104, and hence the SBD attains a high breakdown voltage. Alternatively, in the case where a forward bias voltage is applied, electrons flow from the ohmic electrode 101 through the buffer layer 103 and the n-type GaN layer 104 to the Schottky electrode 105.

CONVENTIONAL EXAMPLE 2

FIG. 11 shows the cross-sectional structure of an SBD using a nitride semiconductor material according to Conventional Example 2 (see, for example, Japanese Laid-Open Patent Publication No. 2004-31896). As shown in FIG. 11, a buffer layer 112 of AlN is formed on a sapphire substrate 111, and an undoped GaN layer 113 and an undoped AlGaN layer 114 are formed on the buffer layer 112. A Schottky electrode 115 and an ohmic electrode 116 are formed on the AlGaN layer 114 to be spaced from each other. Since charges are supplied onto the interface between the GaN layer 113 and the AlGaN layer 114 due to piezo polarization and spontaneous polarization, a two-dimensional electron gas with a high concentration of a density of approximately $10^{13}$ cm$^{-2}$ is formed on the interface. When a forward bias voltage is applied to this SBD, electrons flow in a horizontal direction to the sapphire substrate 111 owing to the two-dimensional electron gas (2DEG) formed on the interface between the GaN layer 113 and the AlGaN layer 114.

The conventional SBDs have, however, the following problems: The first problems is caused because the depletion layer extends, in applying a backward bias voltage, to the peripheral portion of the SBD where a large number of crystal defects are caused by mechanical damage occurring in dicing process. Accordingly, the electric field is collected in the peripheral portion of the SBD, resulting in lowering the breakdown voltage of the SBD.

The second problem is that it is very difficult to integrate SBDs on a substrate. In order to integrate SBDs on one substrate, it is necessary to independently provide Schottky electrodes and ohmic electrodes of the respective SBDs. In Conventional Example 1, however, it is necessary to provide an ohmic electrode on the back face of the substrate, and hence, even when a plurality of SBDs are formed on one substrate, it is impossible to supply different potentials to the ohmic electrodes of the respective SBDs.

Also in Conventional Example 2, the potentials of ohmic electrodes adjacent to each other are made equivalent to each other by the 2DEG. Furthermore, even when SBDs are isolated from one another through mesa etching of portions around the SBDs in, for example, Conventional Example 2, breakdown occurs at a voltage of 200 V or less. Accordingly, it is difficult to realize an integrated circuit including SBDs, each of which requires a higher breakdown voltage. Thus, an integrated circuit including SBDs has not been realized yet.

SUMMARY OF THE INVENTION

An object of the invention is preventing lowering of a breakdown voltage of a Schottky barrier diode (SBD) and applying different voltages respectively to a plurality of SBDs, so as to realize an SBD with a high breakdown voltage and a compact integrated circuit in which SBDs with a high breakdown voltage are integrated.

In order to achieve the object, in the SBD according to the invention, a Schottky electrode and an ohmic electrode are formed in a portion surrounded with a high-resistance region.

Specifically, the Schottky barrier diode (SBD) of this invention includes a first semiconductor layer and a second semiconductor layer successively formed above a substrate; a high-resistance region formed in the first semiconductor layer and the second semiconductor layer and having higher resistance than the first semiconductor layer and the second semiconductor layer; and a Schottky electrode and an ohmic electrode spaced from each other and formed on the second semiconductor layer in a portion surrounded with the high-resistance region.

In the SBD of this invention, it is possible to prevent a depletion layer from extending to a peripheral portion with poor crystallinity of the SBD in applying a backward bias voltage to the SBD. Accordingly, it is possible to realize an SBD having a high breakdown voltage and free from lowering of the breakdown voltage derived from electric field collection. Also, since the SBD can be electrically insulated from the outside portion, such SBDs can be integrated.

In the Schottky barrier diode of the invention, the Schottky electrode is preferably formed to surround the ohmic electrode. Thus, since all the sides of the ohmic electrode can be made to oppose the Schottky electrode, the ohmic electrode can efficiently function, so as to make the SBD compact.

In the Schottky barrier diode of the invention, the Schottky electrode preferably has an outline in a square shape in a plan view. Thus, a plurality of SBDs can be efficiently integrated.

In the Schottky barrier diode of the invention, the Schottky electrode preferably has at least one cut portion. Thus, the Schottky electrode can be easily formed.

In the Schottky barrier diode of the invention, the substrate is preferably made of sapphire, silicon, silicon carbide or gallium nitride. Also, each of the first semiconductor layer and the second semiconductor layer is preferably made of a compound represented by a general formula, $In_aGa_bAl_cB_dN$, wherein $0 \leq a, b, c, d \leq 1$ and $a+b+c+d=1$, and the second semiconductor layer preferably has a larger band gap than the first semiconductor layer. Thus, a nitride SBD with a high breakdown voltage can be definitely obtained.

In the Schottky barrier diode of the invention, the high-resistance region is preferably made of a thermally oxidized film obtained by annealing the first semiconductor layer and the second semiconductor layer. Alternatively, the high-resistance region may be an impurity implanted region formed by implanting impurity ions into the first semiconductor layer and the second semiconductor layer. Thus, the high-resistance region can be definitely formed.

The integrated circuit of this invention includes a plurality of Schottky barrier diodes formed on one substrate, and each of the Schottky barrier diodes includes a first semiconductor layer and a second semiconductor layer successively formed above a substrate; a high-resistance region formed in the first semiconductor layer and the second semiconductor layer and having higher resistance than the first semiconductor layer and the second semiconductor layer; and a Schottky electrode and an ohmic electrode spaced from each other and formed on the second semiconductor layer in a portion surrounded with the high-resistance region.

In the integrated circuit of this invention using the Schottky barrier diodes, the electrodes of the respective SBDs can be insulated from one another, and hence, different voltages can be applied to the respective electrodes. As a result, an electronic circuit using the SBDs can be integrated as one component.

In the integrated circuit of this invention, at least two of the plurality of Schottky barrier diodes are preferably electrically insulated from each other at the Schottky electrodes thereof. Also, at least two of the plurality of Schottky barrier diodes are preferably electrically insulated from each other at the ohmic electrodes thereof. Thus, different voltages can be definitely applied to the respective electrodes.

In the integrated circuit of the invention, at least two of the plurality of Schottky barrier diodes are preferably serially connected to each other. In this case, an intermediate node between the two of Schottky barrier diodes serially connected to each other is preferably an input node.

In the integrated circuit of the invention, the plurality of Schottky barrier diodes preferably together form a bridge rectifier circuit. Alternatively, the plurality of Schottky barrier diodes may together form a voltage limiter circuit.

In this manner, in the Schottky barrier diode and the integrated circuit of this invention, it is possible to prevent lowering of the breakdown voltage of the SBD and different voltages can be applied to electrodes of a plurality of SBDs. Therefore, an SBD with a high breakdown voltage and a compact integrated circuit in which SBDs with a high breakdown voltage are integrated can be realized.

BRIEF DESCRIPTION OF THE DRAWINGS

FIGS. 1A and 1B are diagrams of a Schottky barrier diode according to Embodiment 1 of the invention wherein FIG. 1A is a plan view thereof and FIG. 1B is a cross-sectional view thereof taken on line Ib-Ib of FIG. 1A;

FIGS. 4A and 4B are diagrams of a Schottky barrier diode according to Modification 1 of Embodiment 1 wherein FIG. 4A is a plan view thereof and FIG. 4B is a cross-sectional view thereof taken on line IVb-IVb of FIG. 4A;

FIGS. 5A and 5B are diagrams of a Schottky barrier diode according to Modification 2 of Embodiment 1 wherein FIG. 5A is a plan view thereof and FIG. 5B is a cross-sectional view thereof taken on line Vb-Vb of FIG. 5A;

FIGS. 7A and 7B are diagrams of the integrated circuit of Embodiment 2 wherein FIG. 7A is a plan view thereof and FIG. 7B is a cross-sectional view thereof taken on line VIIb-VIIb of FIG. 7A;

FIGS. 9A and 9B are diagrams of the integrated circuit of the modification of Embodiment 2 wherein FIG. 9A is a plan view thereof and FIG. 9B is a cross-sectional view thereof taken on line IXb-IXb of FIG. 9A;

DETAILED DESCRIPTION OF THE INVENTION

Embodiment 1

Figure 1A:
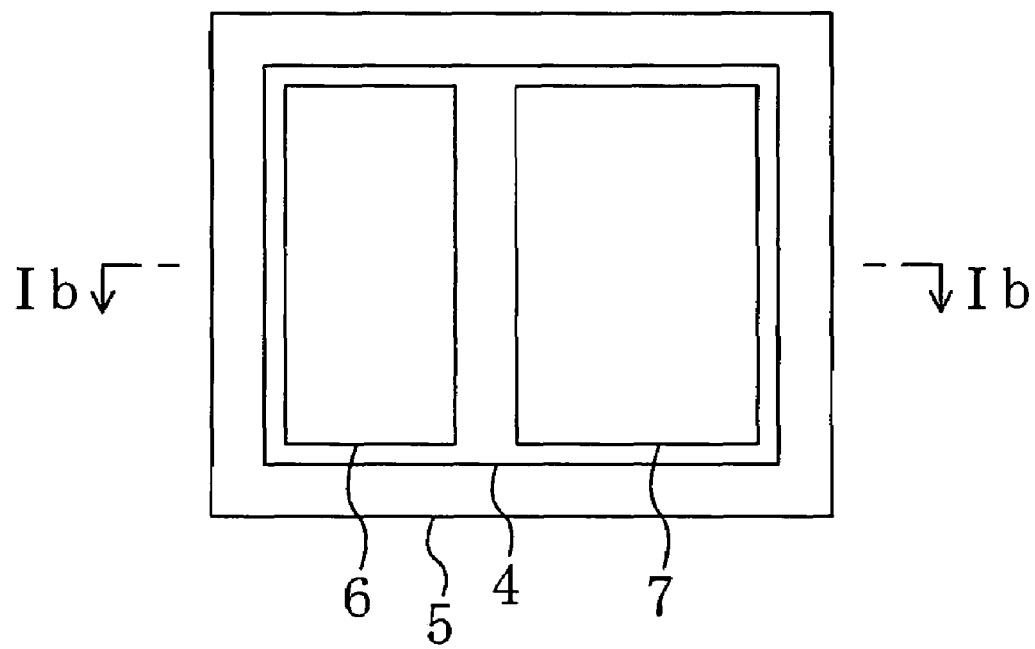
Figure 1B:
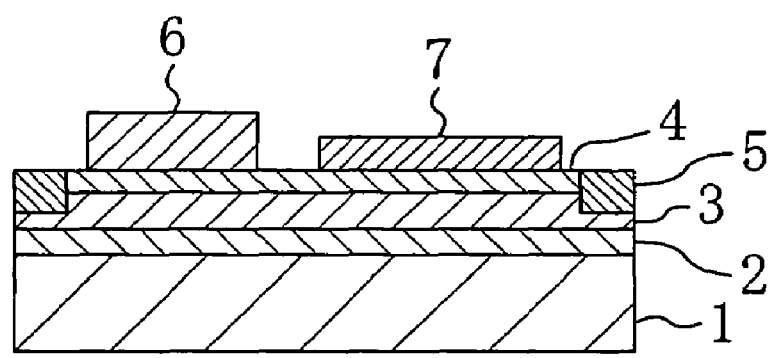

A Schottky barrier diode (SBD) according to Embodiment 1 of the invention will now be described with reference to the accompanying drawings. FIGS. 1A and 1B show the structure of the SBD of this embodiment, and specifically, FIG. 1A is a plan view thereof and FIG. 1B is a cross-sectional view thereof taken on line Ib-Ib of FIG. 1A.

As shown in FIGS. 1A and 1B, a buffer layer 2 of aluminum nitride (AlN) with a thickness of 100 nm, a first semiconductor layer 3 of undoped gallium nitride (GaN) with a thickness of 1500 nm and a second semiconductor layer 4 of undoped aluminum gallium nitride ($Al_{0.26}Ga_{0.74}N$) with a thickness of 25 nm are successively grown by metal organic chemical vapor deposition (MOCVD) on a substrate 1 of sapphire.

A Schottky electrode (anode) 6 composed of successively stacked nickel (Ni) with a thickness of 50 nm and gold (Au) with a thickness of 200 nm and an ohmic electrode (cathode) 7 composed of successively stacked titanium (Ti) with a thickness of 10 nm, aluminum (Al) with a thickness of 200 nm, titanium (Ti) with a thickness of 50 nm and gold (Au) with a thickness of 500 nm are formed on the second semiconductor layer 4 to be spaced from each other.

On an interface in the first semiconductor layer 3 between the first semiconductor layer 3 and the second semiconductor layer 4, a two-dimensional electron gas (2DEG) of a high concentration of approximately $1 \times 10^{13}$ cm$^{-2}$ is present owing to piezo polarization and spontaneous polarization. Therefore, when a forward bias voltage based on a positive voltage of the Schottky electrode is applied between the Schottky electrode 6 and the ohmic electrode 7, a current flows from the Schottky electrode 6 to the ohmic electrode 7 owing to the 2DEG.

On the other hand, when a backward bias voltage is applied between the Schottky electrode 6 and the ohmic electrode 7, a depletion layer extends with the Schottky electrode 6 as the center, and hence, the 2DEG is narrowed and no current flows between the Schottky electrode 6 and the ohmic electrode 7.

If the depletion layer extends to a peripheral portion of the SBD where a larger number of crystal defects are present than in the other region, the electric field is collected, so as to lower the breakdown voltage of the SBD. In the SBD of this embodiment, however, a high-resistance region 5 for surrounding the SBD is provided in the peripheral portion of the SBD. Accordingly, the depletion layer never extends to the peripheral portion of the SBD, and hence, the breakdown voltage of the SBD is never lowered.

Figure 2:
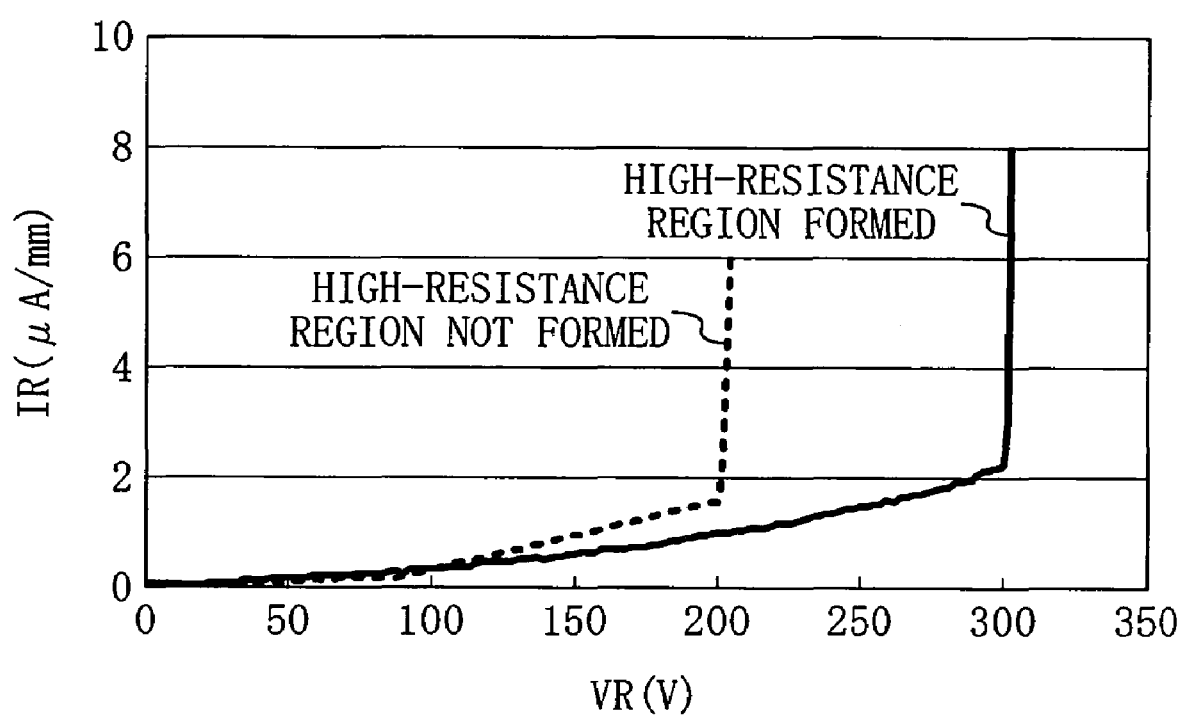
FIG. 2 is a graph for showing a current-voltage characteristic of the Schottky barrier diode of Embodiment 1.

FIG. 2 shows a current-voltage characteristic of the SBD obtained by applying a positive voltage to the ohmic electrode 7 with the voltage of the Schottky electrode 6 set to 0 V. In a conventional SBD not provided with the high-resistance region 5, the breakdown voltage is approximately 200 V as shown with a broken line. On the other hand, the breakdown voltage of the SBD of this embodiment is approximately 300 V as shown with a solid line. Thus, the breakdown voltage is increased by approximately 100 V by providing the high-resistance region 5.

Figure 3A:
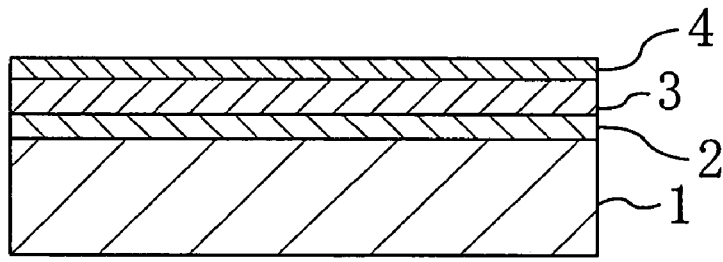
FIGS. 3A, 3B and 3C are cross-sectional views for showing procedures in a method for fabricating the Schottky barrier diode of Embodiment 1.
Figure 3B:
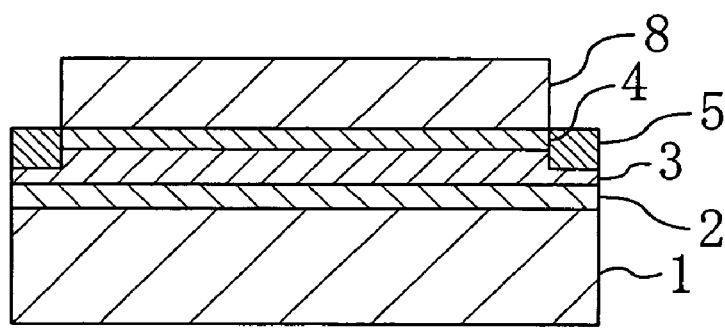
Figure 3C:
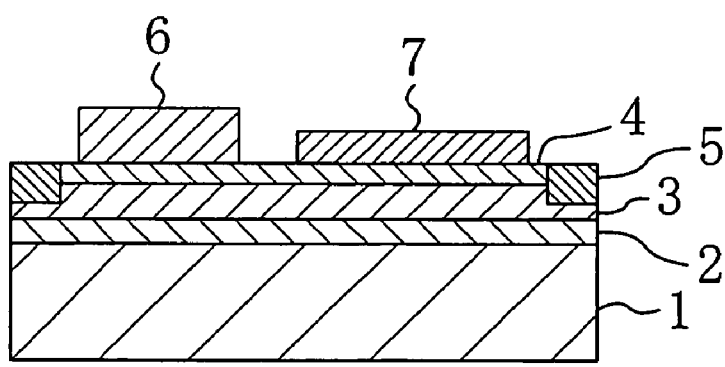

Now, an exemplified method for fabricating the SBD of this embodiment will be described. FIGS. 3A through 3C are cross-sectional views for showing procedures in the method for fabricating the SBD. First, as shown in FIG. 3A, a buffer layer 2 of AlN with a thickness of 100 nm is deposited on a substrate 1 of sapphire by the MOCVD. Then, undoped GaN with a thickness of 1500 nm and undoped Al$_{0.26}$Ga$_{0.74}$N with a thickness of 25 nm are successively deposited on the buffer layer 2, thereby forming a first semiconductor layer 3 and a second semiconductor layer 4.

Next, a silicon (Si) film 8 is deposited and patterned on the second semiconductor layer 4 as shown in FIG. 3B, thereby masking the top face of the second semiconductor layer 4 excluding a peripheral portion of the SBD where a high-resistance region 5 is to be formed. In this masking state, annealing is performed in an oxygen atmosphere at a temperature of 1000° C. for 20 minutes, thereby forming the high-resistance region 5 in the peripheral portion of the SBD.

Next, after removing the mask, as shown in FIG. 3C, Ti with a thickness of 10 nm, Al with a thickness of 200 nm, Ti with a thickness of 50 nm and Au with a thickness of 500 nm are successively deposited on the second semiconductor layer 4, these layers are subjected to lift-off, and annealing is performed at a temperature of 600° C., thereby forming an ohmic electrode 7. Subsequently, Ni with a thickness of 50 nm and Au with a thickness of 200 nm are successively deposited on the second semiconductor layer 4, these layers are subjected to the lift-off and annealing is performed, thereby forming a Schottky electrode 6.

Although a combination of GaN and Al$_{0.26}$Ga$_{0.74}$N is used as the first semiconductor layer 3 and the second semiconductor layer 4 in this embodiment, the composition ratio of Al may be arbitrarily modified as far as the two-dimensional electron gas can be formed on the interface between the first semiconductor layer 3 and the second semiconductor layer 4. Although the second semiconductor layer 4 is undoped in this embodiment, it may be doped to have n-type conductivity. Furthermore, a combination of GaAs and AlGaAs, a combination of InGaAs and AlGaAs, a combination InGaAs and InAlAs, a combination of InGaAs and InP or the like may be employed for the first semiconductor layer 3 and the second semiconductor layer 4.

In this embodiment, the high-resistance region 5 has a resistance of $1 \times 10^4$ Ωcm or more and preferably of $1 \times 10^6$ Ωcm or more. Also, ion implantation may be employed instead of the annealing. In this case, nitrogen ions are implanted, for example, at an acceleration voltage of 100 keV and at a dose of $4 \times 10^{13}$ cm$^{-2}$.

Modification 1 if Embodiment 1

Figure 4A:
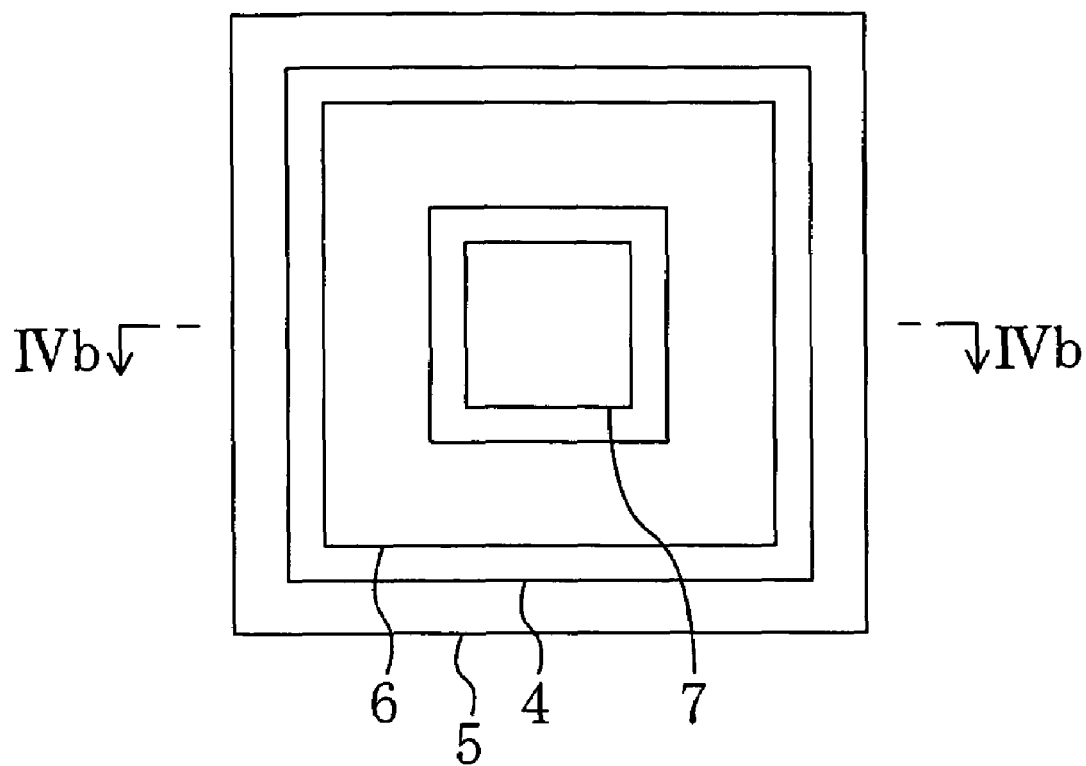
Figure 4B:
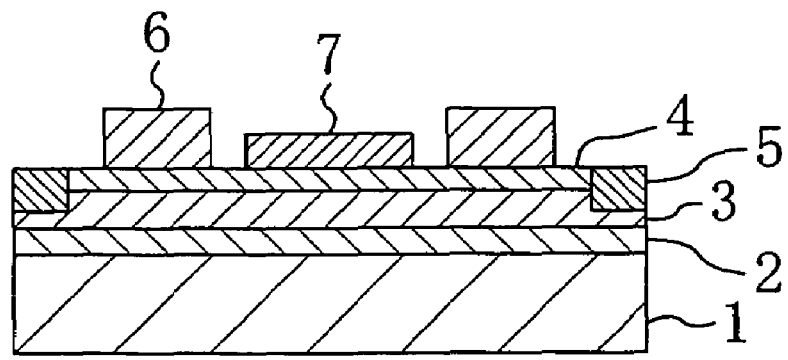

An SBD according to Modification 1 of Embodiment 1 will now be described with reference to the accompanying drawings. FIGS. 4A and 4B show the structure of the SBD of this modification, and specifically, FIG. 4A is a plan view thereof and FIG. 4B is a cross-sectional view thereof taken on line IVb-IVb of FIG. 4A. In FIGS. 4A and 4B, like reference numerals are used to refer to like elements shown in FIGS. 1A and 1B so as to omit the description.

As shown in FIG. 4A, the SBD of this modification includes a Schottky electrode 6 having an outline in a square shape in the plan view, and the Schottky electrode 6 is formed to surround an ohmic electrode 7 formed in a square shape in the plan view at the center. In an SBD utilizing a two-dimensional electron gas, a forward current flows in parallel to a substrate between a Schottky electrode and an ohmic electrode. Accordingly, in order to allow a large current to flow in the SBD, it is necessary to make as long as possible an opposing portion between the Schottky electrode 6 and the ohmic electrode 7.

In the SBD of this modification, the Schottky electrode 6 is formed so as to be spaced from and surround the ohmic electrode 7 provided at the center. Accordingly, all the sides of the ohmic electrode 7 oppose the Schottky electrode 6, and hence, a current can be efficiently allowed to flow from the Schottky electrode 6 to the ohmic electrode 7.

Although the shape of the outer circumference of the Schottky electrode 6 is a square in the plan view in this modification, it may be a hexagonal shape or a circular shape as far as the Schottky electrode 6 surrounds the ohmic electrode 7. Also, the shape of the outer circumference and the inner circumference of the Schottky electrode 6 may be the same or different. However, for making a distance between the Schottky electrode 6 and the ohmic electrode 7 uniform as far as possible, the plan shape of the inner circumference of the Schottky electrode 6 and the plan shape of the ohmic electrode 7 are preferably similar to each other.

Modification 2 of Embodiment 1

Figure 5A:
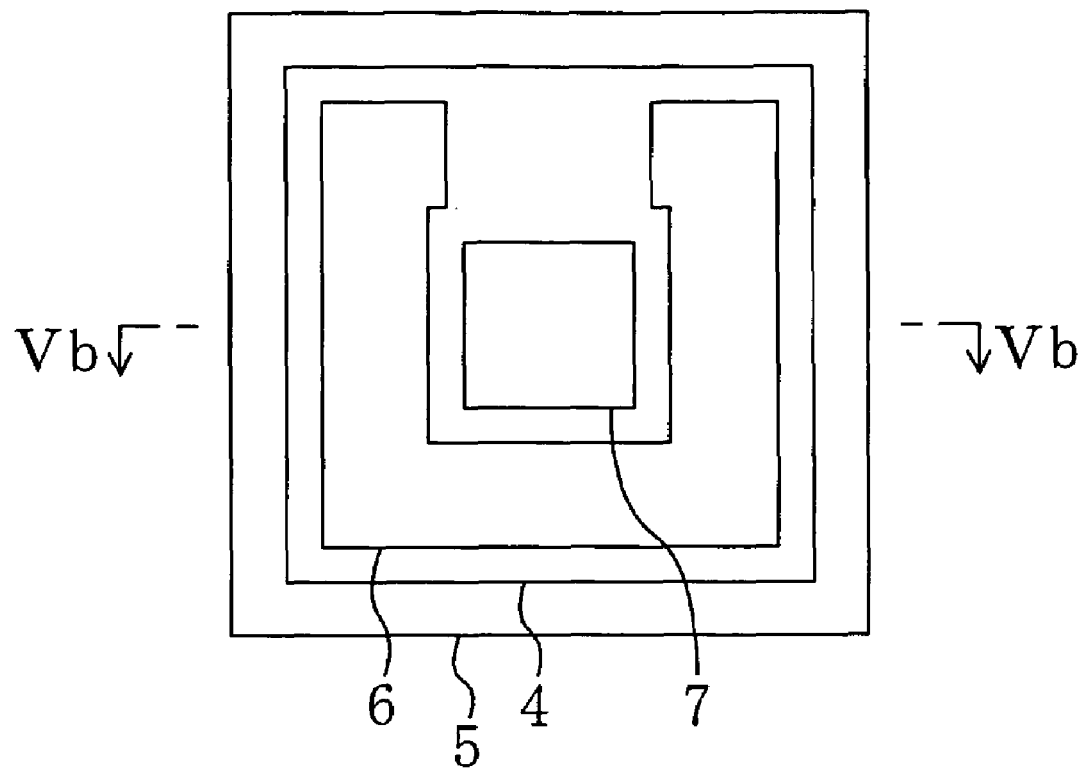
Figure 5B:
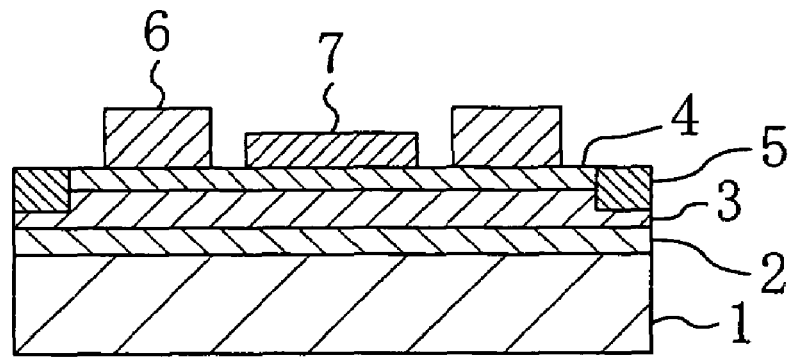

FIGS. 5A and 5B show the structure of an SBD according to Modification 2 of Embodiment 1, and specifically, FIG. 5A is a plan view thereof and FIG. 5B is a cross-sectional view thereof taken on line Vb-Vb of FIG. 5A. In FIGS. 5A and 5B, like reference numerals are used to refer to like elements shown in FIGS. 1A and 1B so as to omit the description. As shown in FIGS. 5A and 5B, in the SBD of this modification, a Schottky electrode 6 does not completely surround an ohmic electrode 7 but has a cut portion.

In the case where the Schottky electrode 6 has the cut portion in this manner, although the length of an opposing portion between the ohmic electrode 7 and the Schottky electrode 6 is shorter, the lift-off can be more easily performed in forming the Schottky electrode 6 than in Modification 1 of Embodiment 1. Therefore, this SBD can be more easily fabricated.

Embodiment 2

Figure 6:
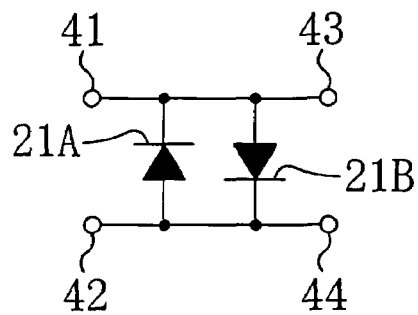
FIG. 6 is an equivalent circuit diagram of an integrated circuit according to Embodiment 2 of the invention.
Figure 7A:
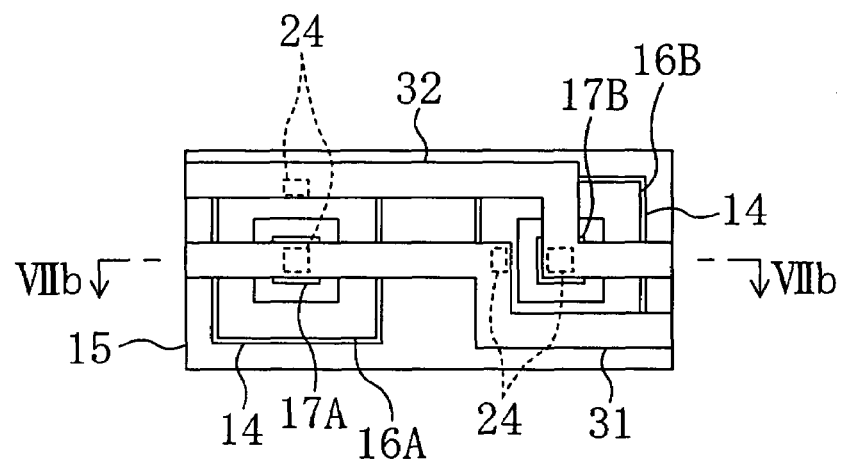
Figure 7B:
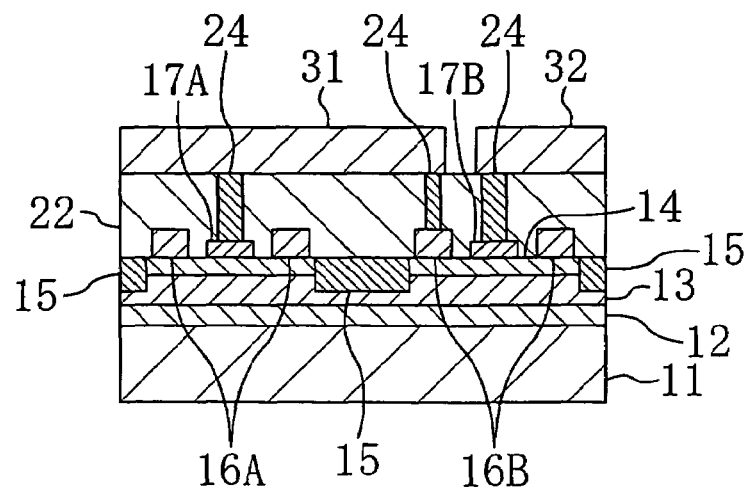

An integrated circuit according to Embodiment 2 of the invention will now be described with reference to the accompanying drawings. FIG. 6 shows an equivalent circuit of the integrated circuit of this embodiment. FIGS. 7A and 7B show the structure of the integrated circuit of this embodiment, and specifically, FIG. 7A is a plan view thereof and FIG. 7B is a cross-sectional view thereof taken on line VIIb-VIIb of FIG. 7A.

As shown in FIG. 6, the integrated circuit of this embodiment is a voltage limiter circuit in which a first SBD 21A and a second SBD 21B are connected to each other in reverse directions. When a voltage applied between an input terminal 41 and an input terminal 42 exceeds the on voltage in the forward direction of the SBDs, a current flows through the SBDs, and hence, a voltage between an output terminal 43 and an output terminal 44 never exceeds the on voltage of the SBDs.

As shown in FIGS. 7A and 7B, a buffer layer 12 of aluminum nitride (AlN) with a thickness of 100 nm, a first semiconductor layer 13 of undoped gallium nitride (GaN) with a thickness of 1500 nm and a second semiconductor layer 14 of undoped aluminum gallium nitride ($Al_{0.26}Ga_{0.74}N$) with a thickness of 25 nm are successively grown on a substrate 11 of sapphire by the metal organic chemical vapor deposition (MOCVD).

An ohmic electrode 17A and an ohmic electrode 17B both in a rectangular shape in the plan view are formed on the second semiconductor layer 14 to be spaced from each other. A Schottky electrode 16A is formed so as to surround the ohmic electrode 17A and a Schottky electrode 16B is formed so as to surround the ohmic electrode 17B.

A high-resistance region 15 is formed so as to surround a side of the Schottky electrode 16A not opposing the ohmic electrode 17A (namely, the outside of the Schottky electrode 16A) and the outside of the Schottky electrode 16B. Thus, a depletion layer does not extend to the peripheral portion of each of the first SBD 21A and the second SBD 21B, and hence, the breakdown voltage is not lowered through the electric field collection. Furthermore, the first SBD 21A and the second SBD 21B are electrically insulated from each other, and different voltages can be applied to a pair of the Schottky electrode 16A of the first SBD 21A and the Schottky electrode 16B of the second SBD 21B and a pair of the ohmic electrode 17A of the first SBD 21A and the ohmic electrode 17B of the second SBD 21B.

An insulating film 22 of benzocyclobutene (BCB) with a thickness of 3 μm is formed on the second semiconductor layer 14 so as to cover the Schottky electrodes 16A and 16B and the ohmic electrodes 17A and 17B. Interconnects 31 and 32 each composed of titanium (Ti) with a thickness of 150 nm and gold (Au) with a thickness of 2000 nm are formed on the insulating film 22.

The Schottky electrode 16A of the first SBD 21A and the ohmic electrode 17B of the second SBD 21B are electrically connected to the interconnect 31 through a via 24. The Schottky electrode 16B of the second SBD 21B and the ohmic electrode 17A of the first SBD 21A are electrically connected to the interconnect 32 through a via 24.

As described above, the limiter circuit including the two SBDs is integrated on one substrate as the integrated circuit of this embodiment. Accordingly, the limiter circuit can be constructed by using merely one component. Also, since the ohmic electrodes of the SBDs are not electrically connected to the substrate in this embodiment, another transistor or the like can be formed on the same substrate.

Although one SBD is connected to another SBD in the reverse directions in this embodiment, a limiter circuit may be constructed by using two sets of SBDs each including two or more SBDs connected in series. In this case, when n SBDs are serially connected to one another, the operation voltage of the resultant limiter circuit is n times as high as the on voltage of the SBD.

Modification of Embodiment 2

Figure 8:
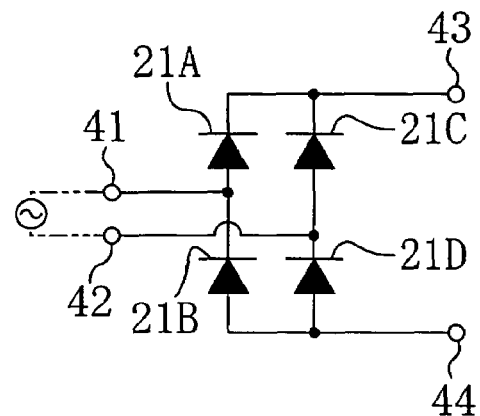
FIG. 8 is an equivalent circuit diagram of an integrated circuit according to a modification of Embodiment 2.
Figure 9A:
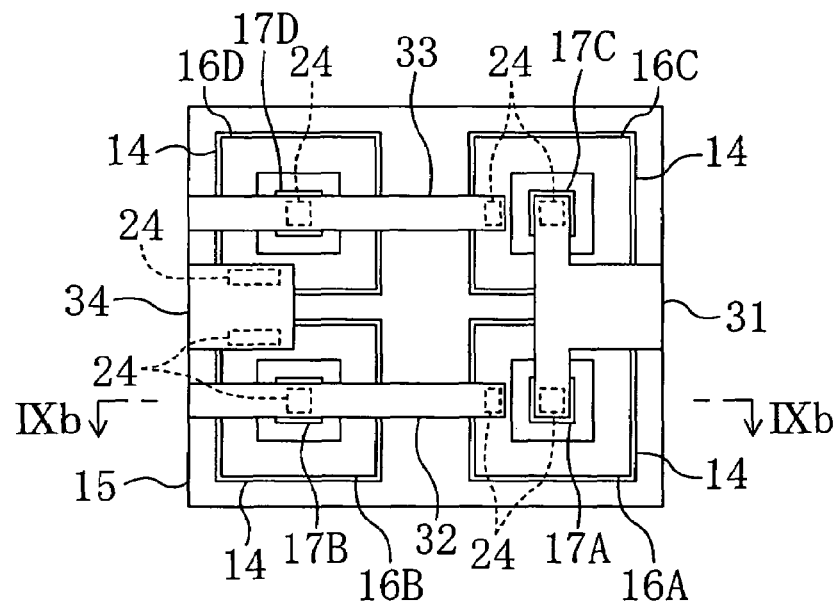
Figure 9B:
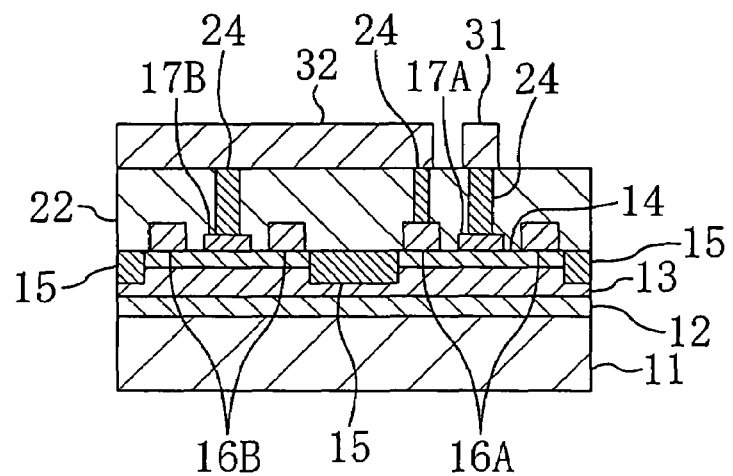
Figure 10:
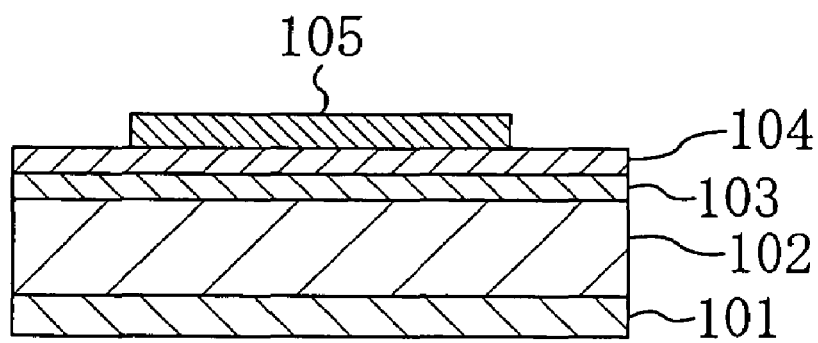
FIG. 10 is a cross-sectional view of a Schottky barrier diode according to Conventional Example 1.
Figure 11:
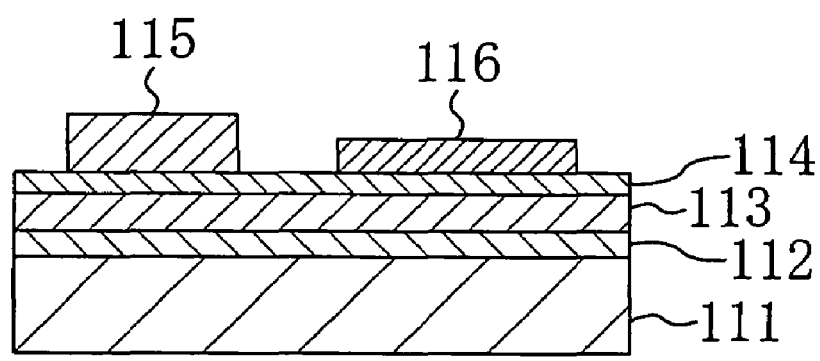
FIG. 11 is a cross-sectional view of a Schottky barrier diode according to Conventional Example 2.

An integrated circuit according to a modification of Embodiment 2 of the invention will now be described with reference to the accompanying drawings. FIG. 8 shows an equivalent circuit of the integrated circuit of this modification. FIGS. 9A and 9B show the structure of the integrated circuit of this modification, and specifically, FIG. 9A is a plan view thereof and FIG. 9B is a cross-sectional view thereof taken on line IXb-IXb of FIG. 9A. In FIGS. 9A and 9B, like reference numerals are used to refer to like elements shown in FIGS. 7A and 7B so as to omit the description.

As shown in FIG. 8, the integrated circuit of this modification is a rectifier circuit including four SBDs in which two sub-circuits each including two SBDs connected in series are combined. This is a two-phase rectifier circuit for outputting DC power from an output terminal when AC power is input to an intermediate node between the sub-circuits. It is noted that a three-phase rectifier circuit can be also realized in a similar manner.

As shown in FIGS. 9A and 9B, the integrated circuit of this modification includes a first SBD 21A, a second SBD 21B, a third SBD 21C and a fourth SBD 21D formed on one substrate. A high-resistance region 15 is formed so as to surround the first through fourth SBDs 21A through 21D, and the first through fourth SBDs 21A through 21D are electrically insulated from one another.

An ohmic electrode 17A of the first SBD 21A and an ohmic electrode 17C of the third SBD 21C are connected to each other through an interconnect 31, on which an output terminal 43 is formed. A Schottky electrode 16B of the second SBD 21B and a Schottky electrode 16D of the fourth SBD 21D are connected to each other through an interconnect 34, on which an output terminal 44 is formed.

A Schottky electrode 16A of the first SBD 21A and an ohmic electrode 17B of the second SBD 21B are connected to each other through an interconnect 32, on which an input terminal 41 is formed. A Schottky electrode 16C of the third SBD 21C and an ohmic electrode 17D of the fourth SBD 21D are connected to each other through an interconnect 33, on which an input terminal 42 is formed.

In this modification, a rectifier, which cannot be conventionally integrated but should be constructed by using four SBDs, can be constructed by using merely one component. Therefore, the occupied area of the rectifier circuit can be made small and the assembling process for the circuit can be simplified.

As described so far, according to a Schottky barrier diode and an integrated circuit using the same of this invention, lowering of the breakdown voltage of the Schottky barrier diode can be prevented, and different voltages can be applied to respective electrodes of a plurality of SBDs. Therefore, it is possible to realize a SBD with a high breakdown voltage and a compact integrated circuit in which SBDs with a high breakdown voltage are integrated. In this manner, the invention is useful for a Schottky barrier diode made of a nitride semiconductor material and an integrated circuit or the like using the same.

What is claimed is:

1. A Schottky barrier diode comprising:
   a first semiconductor layer and a second semiconductor layer successively formed above a substrate;
   a high-resistance region formed in said first semiconductor layer and said second semiconductor layer and having higher resistance than said first semiconductor layer and said second semiconductor layer; and
   a Schottky electrode and an ohmic electrode spaced from each other and formed on said second semiconductor layer in a portion surrounded with said high-resistance region,
   wherein each of said first semiconductor layer and said second semiconductor layer is made of a compound represented by a general formula, $In_aGa_bAl_cB_dN$, wherein $0 \leq a, b, c, d \leq 1$ and $a+b+c+d=1$, said second semiconductor layer has a larger band gap than said first semiconductor layer, and said first semiconductor layer is undoped, and
   said high-resistance region is an impurity implanted region formed by implanting impurity ions into said first semiconductor layer and said second semiconductor layer and is not formed in the lowest part of said first semiconductor layer.

2. The Schottky barrier diode of claim 1, wherein said substrate is made of sapphire, silicon, silicon carbide or gallium nitride.

3. A Schottky barrier diode comprising:
   a first semiconductor layer and a second semiconductor layer successively formed above a substrate;
   a high-resistance region formed in said first semiconductor layer and said second semiconductor layer and having higher resistance than said first semiconductor layer and said second semiconductor layer; and
   a Schottky electrode and an ohmic electrode spaced from each other and formed on said second semiconductor layer in a portion surrounded with said high-resistance region,
   wherein said Schottky electrode surrounds said ohmic electrode, has at least one cut portion and does not completely cover said ohmic electrode.

4. An integrated circuit comprising a plurality of Schottky barrier diodes formed on one substrate,
   wherein each of said Schottky barrier diodes includes:
      a first semiconductor layer and a second semiconductor layer successively formed above a substrate;
      a high-resistance region formed in said first semiconductor layer and said second semiconductor layer and having higher resistance than said first semiconductor layer and said second semiconductor layer; and
      a Schottky electrode and an ohmic electrode spaced from each other and formed on said second semiconductor layer in a portion surrounded with said high-resistance region,
   wherein each of said first semiconductor layer and said second semiconductor layer is made of a compound represented by a general formula, $In_aGa_bAl_cB_dN$, wherein $0 \leq a, b, c, d \leq 1$ and $a+b+c+d=1$, said second semiconductor layer has a larger band gap than said first semiconductor layer, and said first semiconductor layer is undoped, and
   said high-resistance region is an impurity implanted region formed by implanting impurity ions into said first semiconductor layer and said second semiconductor layer and is not formed in the lowest part of said first semiconductor layer.

5. The integrated circuit of claim 4, wherein at least two of said plurality of Schottky barrier diodes are electrically insulated from each other at said Schottky electrodes thereof.

6. The integrated circuit of claim 4, wherein at least two of said plurality of Schottky barrier diodes are electrically insulated from each other at said ohmic electrodes thereof.

7. The integrated circuit of claim 4, wherein at least two of said plurality of Schottky barrier diodes are serially connected to each other.

8. The integrated circuit of claim 7, wherein an intermediate node between said two of Schottky barrier diodes serially connected to each other is an input node.

9. The integrated circuit of claim 8, wherein said plurality of Schottky barrier diodes together form a bridge rectifier circuit.

10. The integrated circuit of claim 4, wherein said plurality of Schottky barrier diodes together form a voltage limiter circuit.

11. An integrated circuit comprising a plurality of Schottky barrier diodes formed on one substrate,
    wherein each of said Schottky barrier diodes includes:
       a first semiconductor layer and a second semiconductor layer successively formed above a substrate;
       a high-resistance region formed in said first semiconductor layer and said second semiconductor layer and having higher resistance than said first semiconductor layer and said second semiconductor layer; and
       a Schottky electrode and an ohmic electrode spaced from each other and formed on said second semiconductor layer in a portion surrounded with said high-resistance region,
    wherein said Schottky electrode surrounds said ohmic electrode, has at least one cut portion and does not completely cover said ohmic electrode.

* * * * *